(12) United States Patent
Baek et al.

(10) Patent No.: US 9,466,654 B2
(45) Date of Patent: Oct. 11, 2016

(54) ORGANIC LIGHT EMITTING DISPLAY DEVICE

(71) Applicant: LG Display Co., Ltd., Seoul (KR)

(72) Inventors: Jaewoon Baek, Gyeonggi-do (KR); Samyul Boo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/549,766

(22) Filed: Nov. 21, 2014

(65) Prior Publication Data
US 2015/0155347 A1    Jun. 4, 2015

(30) Foreign Application Priority Data

Dec. 2, 2013   (KR) .................. 10-2013-0148765

(51) Int. Cl.
*H01L 27/32* (2006.01)
*H01L 51/52* (2006.01)

(52) U.S. Cl.
CPC ......... *H01L 27/3272* (2013.01); *H01L 27/322* (2013.01); *H01L 27/3246* (2013.01); *H01L 51/5203* (2013.01)

(58) Field of Classification Search
None
See application file for complete search history.

(56) References Cited

U.S. PATENT DOCUMENTS

| | | | |
|---|---|---|---|
| 2006/0038953 A1* | 2/2006 | Moriya | 349/144 |
| 2011/0096540 A1* | 4/2011 | Oda | H01L 51/5265 362/231 |
| 2012/0032151 A1* | 2/2012 | Hama | G02B 5/223 257/40 |
| 2014/0332778 A1* | 11/2014 | Ito | 257/40 |

* cited by examiner

*Primary Examiner* — Calvin Choi
*Assistant Examiner* — Xiaoming Liu
(74) *Attorney, Agent, or Firm* — Morgan, Lewis & Bockius LLP

(57) ABSTRACT

An organic light emitting display device is provided having first and second pixel areas. The organic light emitting display device includes a first substrate; a second substrate facing the first substrate; a bank layer on the first substrate at a boundary region between the first and second pixel areas; a light emitting layer on the first substrate within the first pixel area; a light shielding layer on the second substrate at the boundary region between the first and second pixel areas; and a color filter on the second substrate within the first pixel area. A top of the bank layer is higher than a top of the light emitting layer with respect to the first substrate, and a top of the light shielding layer is higher a top of the color filter with respect to the second substrate.

19 Claims, 6 Drawing Sheets

ORGANIC LIGHT EMITTING DISPLAY DEVICE

CROSS REFERENCE TO RELATED APPLICATIONS

This application claims the benefit of the Korean Patent Application No. 10-2013-0148765 filed on Dec. 2, 2013, which is hereby incorporated by reference for all purposes as if fully set forth herein.

BACKGROUND OF THE INVENTION

1. Field of the Invention

The present invention relates to an organic light emitting display device, and more particularly, to an organic light emitting display device having a color filter.

2. Discussion of the Related Art

An organic light emitting display device includes an organic light emitting element provided with a light emitting layer formed between a cathode and an anode, wherein electrons are injected into the light emitting layer from the cathode, and holes are injected into the light emitting layer from the anode. If the electrons generated in the cathode and the holes generated in the anode are injected into the light emitting layer, an exciton is generated by combination of the injected electrons and holes. The generated exciton is then transited from the excited state to a ground state, whereby light is emitted to display picture images.

Such an organic light emitting display device provides a full color by emitting red (R) light, green (G) light, and blue (B) light for each pixel. To this end, the organic light emitting display device may include a pixel having a light emitting layer emitting red (R) light, a pixel having a light emitting layer emitting green (G) light, and a pixel having a light emitting layer emitting blue (B) light, thereby providing a full color. Alternatively, the organic light emitting display device may provide a full color in such a manner that light emitting layers of all the pixels emit white (W) light and color filters of red (R), green (G) and blue (B) are additionally provided for each pixel.

Hereinafter, an organic light emitting display device of the related art will be described, in which color filters different from one another for each pixel are provided to obtain a full color.

FIG. 1 is a brief cross-sectional view illustrating an organic light emitting display device of the related art.

As shown in FIG. 1, the organic light emitting display device of the related art includes a lower substrate 10, an upper substrate 20, and an adhesive layer 30. A thin film transistor layer 11, which includes a switching thin film transistor and a driving thin film transistor, is formed on the lower substrate 10, a lower electrode 13 is formed on the thin film transistor layer 11, and a bank layer 15 for defining a light emitting region is formed on the lower electrode 13.

Also, a light emitting layer 17 for emitting white (W) light is formed on the lower electrode 13, and an upper electrode 19 is formed on the light emitting layer 17.

Light shielding layers 21 for preventing light leakage from occurring are formed between respective pixels on the upper substrate 20 in a matrix arrangement, wherein color filters 23 of red (R), green (G) and blue (B) are respectively formed between the respective light shielding layers 21 of the matrix arrangement. The adhesive layer 30 is formed between the lower substrate 10 and the upper substrate 20 to adhere these substrates to each other.

The aforementioned organic light emitting display device of the related art displays a picture image in such a manner that white (W) light emitted from the light emitting layer 17 is emitted upwardly and then passes through the color filter 23 of each pixel to transmit light only of a predetermined color.

However, in the aforementioned organic light emitting display device of the related art, the light emitted from the light emitting layer 17 in each pixel passes through the color filter 23 of another adjacent pixel due to the interval between the light emitting layer 17 and the color filter 23, whereby a color of desired gray scale is not displayed. As a result, a problem occurs in that picture quality is deteriorated.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device that may improve picture quality by minimizing a problem that light emitted from a light emitting layer in each pixel passes through a color filter of another adjacent pixel.

Additional features and advantages of the invention will be set forth in the description which follows, and in part will be apparent from the description, or may be learned from practice of the invention. The objectives and other advantages of the invention may be realized and attained by the structure particularly pointed out in the written description and claims hereof as well as the appended drawings.

To achieve these and other advantages and in accordance with the purpose of the present invention, as embodied and broadly described, an organic light emitting display device, which has a first pixel area and a second pixel area, comprises a first substrate; a second substrate facing the first substrate; a bank layer on the first substrate at a boundary region between the first and second pixel areas; a light emitting layer on the first substrate within the first pixel area; a light shielding layer on the second substrate at the boundary region between the first and second pixel areas; and a color filter on the second substrate within the first pixel area, wherein a top of the bank layer is higher than a top of the light emitting layer with respect to the first substrate, and a top of the light shielding layer is higher a top of the color filter with respect to the second substrate.

In another aspect, an organic light emitting display device, which has a first pixel area and a second pixel area, comprises a first substrate; a second substrate facing the first substrate; a bank layer on the first substrate at a boundary region between the first and second pixel areas; a light emitting layer on the first substrate within the first pixel area; a light shielding layer on the second substrate at the boundary region between the first and second pixel areas; and a color filter on the second substrate within the first pixel area, wherein a height difference between a top of the bank layer and a top of the light emitting layer with respect to the first substrate and a height difference between a top of the light shielding layer and a top of the color filter with respect to the second substrate are set to satisfy the Equation Hcell−Ls/tan θ≤Δh1+Δh2, where Hcell is a distance between the light emitting layer and the color filter, Ls is a width of the light shielding layer, θ is a maximum viewing angle for preventing light leakage from occurring between the first and second pixel areas, Δh1 is the height difference between the top of the light shielding layer and the top of the color filter, and Δh2 is the height difference between the top of the bank layer and the top of the light emitting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

The terminology "on" disclosed in this specification encompasses an element is formed directly on another element or a third element is interposed between these elements.

Hereinafter, the embodiments of the present invention will be described with reference to the accompanying drawings.

Figure 1:
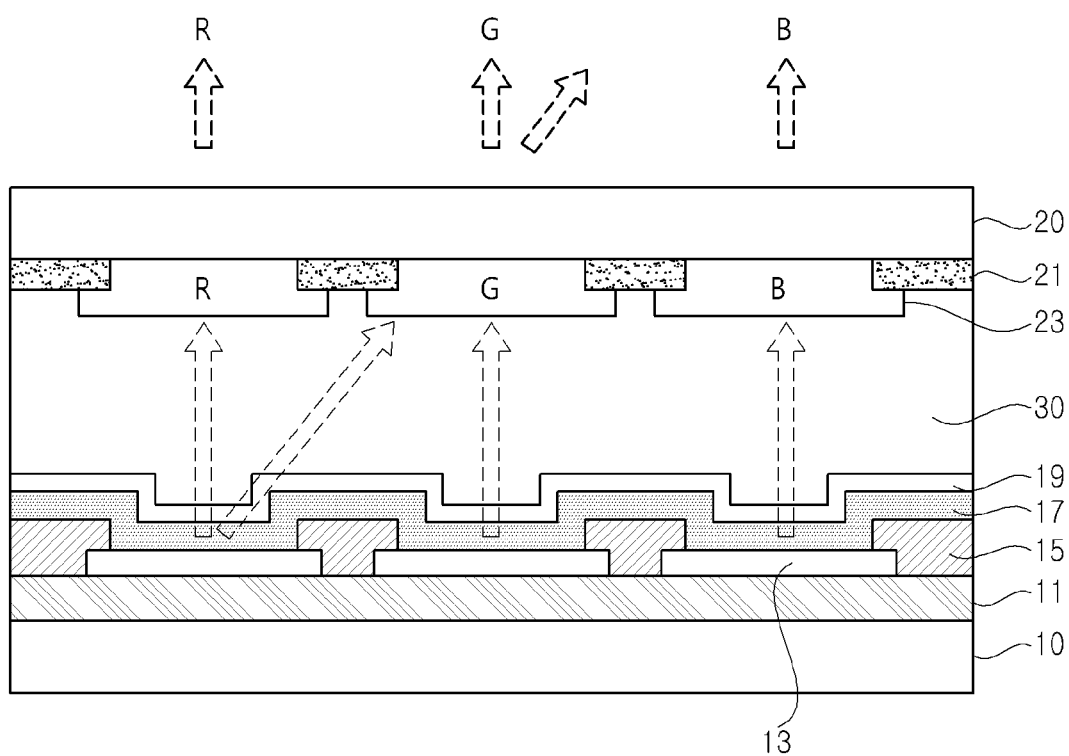
FIG. 1 is a cross-sectional view illustrating an organic light emitting display device according to the related art.
Figure 2:
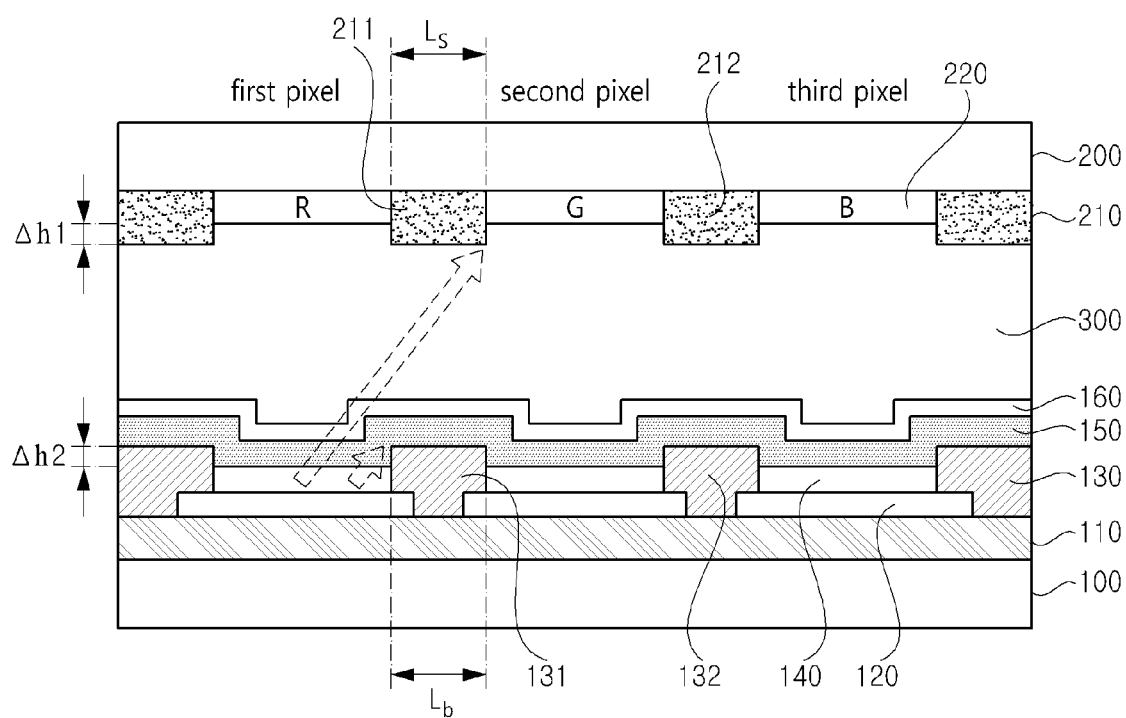
FIG. 2 is a cross-sectional view illustrating an organic light emitting display device according to one embodiment of the present invention.

FIG. 2 is a cross-sectional view illustrating an organic light emitting display device according to one embodiment of the present invention.

As shown in FIG. 2, the organic light emitting display device according to one embodiment of the present invention includes a first substrate 100, a second substrate 200, and an adhesive layer 300. The organic light emitting display device according to one embodiment of the present invention includes a first pixel, a second pixel, and a third pixel. The first pixel may be made of, but not limited to, a pixel emitting red (R) light, the second pixel may be made of, but not limited to, a pixel emitting green (G) light, and the third pixel may be made of, but not limited to, a pixel emitting blue (B) light.

On the first substrate 100, in more detail, on one surface of the first substrate 100 facing the second substrate 200, a thin film transistor layer 110, a first electrode 120, a bank layer 130, a light emitting layer 140, a second electrode 150, and a passivation layer 160 are formed. The first substrate 100 may be made of, but not limited to, glass or transparent plastic such as polyimide, wherein the transparent plastic may be bent or flexible.

The thin film transistor layer 110 includes a plurality of lines, such as gate lines, data lines and power lines, and a switching thin film transistor and a driving thin film transistor, which are connected with the plurality of lines for each pixel. Also, a capacitor may be formed by combination of lines and electrodes of the thin film transistors. Various modifications known in the art may be made in the lines and the thin film transistors, which constitute the thin film transistor layer 110.

The first electrode 120 is formed on the thin film transistor layer 110 for each pixel. Although not shown in detail, the first electrode 120 is electrically connected with a source electrode or drain electrode of the driving thin film transistor.

The organic light emitting display device according to one embodiment of the present invention is related to a top emission type organic light emitting display device in which a light emitted from the light emitting layer 140 is transmitted upwardly. Accordingly, the first electrode 120 may be made of an opaque conductive material that may upwardly reflect the light emitted from the light emitting layer 140. Meanwhile, the first electrode 120 may be made of, but not limited to, a double layer structure of a transparent conductive material and an opaque conductive material.

The bank layer 130 is formed on the first electrode 120. The bank layer 130 is patterned in a matrix arrangement to define a light emitting region. Namely, each pixel displaying picture image is surrounded by the bank layer 130. The bank layer 130 is formed at a boundary region between the respective pixels. Accordingly, the bank layer 130 includes a first bank layer 131 formed at a boundary region between the first pixel and the second pixel, and a second bank layer 132 formed at a boundary region between the second pixel and the third pixel. The bank layer 130 may be formed of a light shielding material.

The light emitting layer 140 is formed in the respective pixels surrounded by the bank layer 130. In more detail, the light emitting layer 140 is formed in the respective pixels in such a manner that the light emitting layer 140 does not overlap the bank layer 130.

Although not shown in detail, the light emitting layer 140 may be formed in a structure that a hole injecting layer, a hole transporting layer, an organic emitting material layer, an electron transporting layer, and an electron injecting layer are sequentially deposited. However, one or more of the hole injecting layer, the hole transporting layer, the electron transporting layer, and the electron injecting layer except for the organic light emitting layer may be omitted.

Since the organic light emitting display device according to one embodiment of the present invention includes a color filter as will be described later, it does not need to emit colored light within each pixel, whereby the light emitting layer 140 may be provided to emit white light. The light emitting layer 140 emitting white light may be made of combination of a red light emitting layer, a green light emitting layer and a blue light emitting layer, or may be made of combination of an orange light emitting layer and a blue light emitting layer. In addition, various modifications known in the art may be made in the light emitting layer 140 emitting white light.

The second electrode 150 is formed on the light emitting layer 140. The second electrode 150 may serve as a common electrode, whereby the second electrode 150 may also be formed on the bank layer 130 as well as the light emitting layer 140. The second electrode 150 is made of a transparent conductive material, whereby the light emitted from the light emitting layer 140 may be emitted upwardly by transmitting the second electrode 150.

The passivation layer 160 is formed on the second electrode 150. The passivation layer 160 may be formed by depositing at least one of an inorganic insulating material and an organic insulating material on an entire surface of the second electrode 150. The passivation layer 160 may be made of a single layer, or may be made of a plurality of layers of an inorganic insulating material and an organic insulating material, which are alternately deposited. This passivation layer 160 serves to passivate the inside of the display device and prevent water from permeating into the display device.

On the second substrate 200, in more detail, on one surface of the second substrate 200 facing the first substrate 100, a light shielding layer 210 and a color filter 220 are formed. The second substrate 200 may be made of, but not limited to, glass or transparent plastic such as polyimide, wherein the transparent plastic may be bent or flexible.

The light shielding layer 210 is intended to prevent light leakage from occurring at a boundary region between the pixels, and has a matrix structure. The light shielding layer 210 includes a first light shielding layer 211 formed at a boundary region between the first pixel and the second pixel, and a second light shielding layer 212 formed at a boundary region between the second pixel and the third pixel.

This light shielding layer 210 is formed to overlap the bank layer 130. The first light shielding layer 211 overlaps the first bank layer 131, and the second light shielding layer 212 overlaps the second bank layer 132. The light shielding layer 210 may be formed of various light shielding materials known in the art.

The color filter 220 is formed in a region between the light shielding layers 210. In more detail, the color filter 220 is formed in a region between the light shielding layers 210, that is, within each pixel, without being overlapped with the light shielding layers 210. This color filter 220 includes a red (R) color filter, a green (G) color filter and a blue (B) color filter, which are patterned for each pixel.

The adhesive layer 300 is formed between the first substrate 100 and the second substrate 200, in more detail, between the passivation layer 160 of the first substrate 100 and the light shielding layer 210/color filter 220 of the second substrate 200 to adhere both substrates or both layers to each other. The adhesive layer 300 may serve to adhere both substrates to each other and also prevent water from being permeated into the display device. This adhesive layer 300 may be formed using various materials known in the art. For example, the adhesive layer 300 may be formed using a film structure, such as a double-sided tape, or may be formed by coating a liquid adhesive material, such as a sealant, and then hardening the liquid adhesive material.

According to the organic light emitting display device according to one embodiment of the present invention, the light shielding layer 210 is formed to be higher than the color filter 220 on the basis of the surface of the second substrate 200. In other words, the top of the light shielding layer 210 is higher than that of the color filter 220 as much as a first height difference $\Delta h1$ based on the surface of the second substrate 200. Since such a predetermined first height difference $\Delta h1$ exists between the top of the light shielding layer 210 and the top of the color filter 220, it is reduced that the light emitted from the light emitting layer 140 of one pixel may pass through the color filter 220 of another adjacent pixel, whereby picture quality may be improved.

Also, the bank layer 130 is formed to be higher than the light emitting layer 140 on the basis of the surface of the first substrate 100. In other words, the top of the bank layer 130 is higher than that of the light emitting layer 140 as much as a second height difference $\Delta h2$ based on the surface of the first substrate 100. Since such a predetermined second height difference $\Delta h2$ exists between the top of the bank layer 130 and the top of the light emitting layer 140, it is reduced that the light emitted from the light emitting layer 140 of one pixel may pass through the color filter 220 of another adjacent pixel, whereby picture quality may be improved.

Also, to increase the effect of preventing light leakage between adjacent pixels from occurring, the light shielding layer 210 overlapping the bank layer 130 may be formed having a width Ls greater than a width Lb of the bank layer 130. In other words, it is preferable that the first light shielding layer 211 may be formed having the width Ls greater than the width Lb of the first bank layer 131 and the second light shielding layer 21 is formed to have the width Ls greater than the width Lb of the second bank layer 132. However, if the width Ls of the light shielding layer 210 is greater than the width Lb of the bank layer 130, a problem occurs in that light transmittance is deteriorated, whereby luminance is deteriorated.

Accordingly, considering prevention of light leakage between adjacent pixels and prevention of luminance deterioration, the light shielding layer 210 may be formed to have the width Ls equal to the width Lb of the bank layer 130. In this specification, it is to be understood that the disclosure that the width Ls of the light shielding layer 210 is equal to the width Lb of the bank layer 130 includes that both widths are equal to each other and also includes that both widths are different from each other within an error range, which may occur during the process. Also, if the light shielding layer 210 and the bank layer 130 are formed in a tapered structure, their lower regions having the greatest widths are formed to have the same width as each other.

As described above, according to one embodiment of the present invention, picture quality may be improved by the first height difference $\Delta h1$ between the top of the light shielding layer 210 and the top of the color filter 220 and the second height difference $\Delta h2$ between the top of the bank layer 130 and the top of the light emitting layer 140. Particularly, the greater the first height difference $\Delta h1$ and the second height difference $\Delta h2$ are, the greater the effect of prevention of light leakage is.

However, to highly set the first height difference $\Delta h1$, the height of the light shielding layer 210 should be increased. In this case, it may be difficult to perform an accurate process. Also, if the height of the light shielding layer 210 is too high, a problem may occur in that the light shielding layer 210 may be broken during the adhesion process. Also, to highly set the second height difference $\Delta h2$, the height of the bank layer 130 should be increased. In this case, it may be difficult to perform the process of forming the second electrode 150 due to serious step difference, and disconnection may occur in the second electrode 150 as the case may be.

Accordingly, to prevent the aforementioned problems from occurring while preventing light leakage between adjacent pixels from occurring, it is preferable to appropriately set the first height difference Δh1 and the second height difference Δh2. Hereinafter, a detailed method for setting the first height difference Δh1 and the second height difference Δh2 will be described.

Figure 3A:
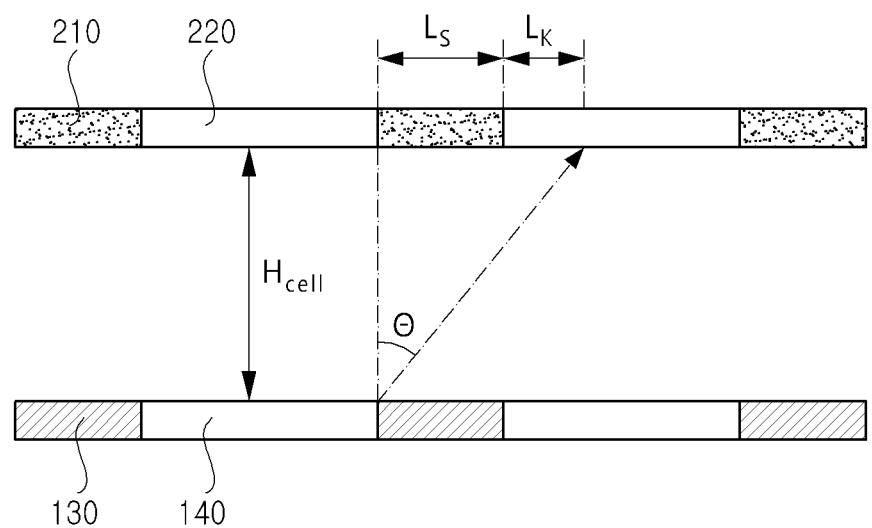
FIGS. 3A and 3B are cross-sectional views illustrating a method for setting a first height difference Δh1 between a top of a light shielding layer and a top of a color filter and setting a second height difference Δh2 between a top of a bank layer and a top of a light emitting layer according to one embodiment of the present invention.
Figure 3B:
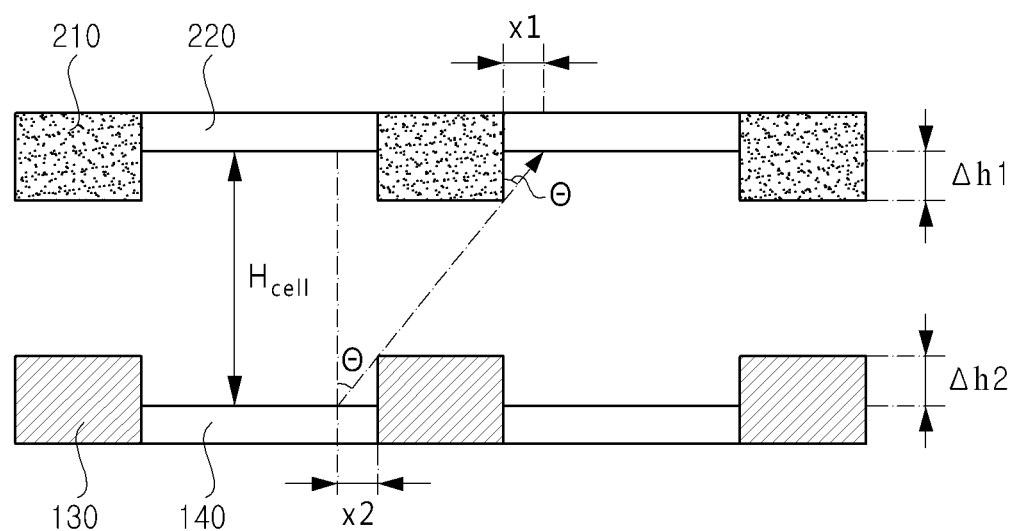

FIGS. 3A and 3B are cross-sectional views illustrating a method for setting the first height difference Δh1 between the top of the light shielding layer 210 and the top of the color filter 220 and setting the second height difference Δh2 between the top of the bank layer 130 and the top of the light emitting layer 140 according to one embodiment of the present invention. FIG. 3A illustrates that the first height difference Δh1 and the second height difference Δh2 do not exist, and FIG. 3B illustrates that the first height difference Δh1 and the second height difference Δh2 exist. For reference, FIGS. 3A and 3B only illustrate the light shielding layer 210, the color filter 220, the bank layer 130 and the light emitting layer 140 for convenience of description.

As shown in FIG. 3A, if there is no height difference between the top of the light shielding layer 210 and the top of the color filter 220 and there is no height difference between the top of the bank layer 130 and the top of the light emitting layer 140, the following Equation 1 is obtained at a predetermined viewing angle θ.

$$\tan \theta = (Ls+Lk)/Hcell \Rightarrow Lk = Hcell \times \tan \theta - Ls \quad \text{[Equation 1]}$$

In the above Equation 1, the viewing angle θ means a maximum viewing angle that allows the light emitted from one pixel not to enter another adjacent pixel, and is set by a manufacturer of the product.

In the above Equation 1, Ls is the width of the light shielding layer 210, and Lk is a length of light leakage generated as the light emitted from one pixel enters another adjacent pixel.

In the above Equation 1, Hcell is a cell gap, and means a distance between the light emitting layer 140 and the color filter 220. As shown in FIG. 2, since the second electrode 150, the passivation layer 160 and the adhesive layer 300 are formed between the light emitting layer 140 and the color filter 220, Hcell becomes sum of thicknesses of the second electrode 150, the passivation layer 160 and the adhesive layer 300.

As can be known from the above Equation 1, if there is no height difference between the top of the light shielding layer 210 and the top of the color filter 220 and there is no height difference between the top of the bank layer 130 and the top of the light emitting layer 140, light leakage occurs as much as the length of (Hcell×tan θ−Ls) at the viewing angle θ. If such a length of light leakage is set to 0 or less, light leakage may be prevented from occurring. This will be described with reference to FIG. 3B.

As can be known from FIG. 3B, if the height of the light shielding layer 210 is increased to generate the first height difference Δh1 between the top of the light shielding layer 210 and the top of the color filter 220 and the height of the bank layer 130 is increased to generate the second height difference Δh2 between the top of the bank layer 130 and the top of the light emitting layer 140, the length of light leakage based on the above Equation 1 is reduced by (x1+x2), whereby the following Equation 2 is obtained.

$$Lk = Hcell \times \tan \theta - Ls - (x1+x2) \quad \text{[Equation 2]}$$

In the above Equation 2, x1 is the length of light leakage, which is reduced by the first height difference Δh1, and x2 is the length of light leakage, which is reduced by the second height difference Δh2.

Meanwhile, in case of FIG. 3B, the following Equations 3 and 4 are obtained at the viewing angle θ.

$$\tan \theta = x1/\Delta h1 \Rightarrow x1 = \Delta h1 \times \tan \theta \quad \text{[Equation 3]}$$

$$\tan \theta = x2/\Delta h2 \Rightarrow x2 = \Delta h2 \times \tan \theta \quad \text{[Equation 4]}$$

If x1 based on the above Equation 3 and x2 based on the above Equation 4 are substituted for the above Equation 2, the following Equation 5 is obtained.

$$Lk = Hcell \times \tan \theta - Ls - (\Delta h1 + \Delta h2) \times \tan \theta \quad \text{[Equation 5]}$$

As can be known from the above Equation 5, since Lk which is the occurrence length of light leakage is defined by [Hcell×tan θ−Ls−(Δh1+Δh2)×tan θ], if Lk is set to 0 or less, light leakage is prevented from occurring. In other words, if the following Equation 6 is obtained, light leakage may be prevented from occurring between adjacent pixels.

$$Hcell \times \tan \theta - Ls - (\Delta h1 + \Delta h2) \times \tan \theta \leq 0 \Rightarrow Hcell - Ls/\tan \theta \leq \Delta h1 + \Delta h2 \quad \text{[Equation 6]}$$

As a result, if a sum of the first height difference Δh1 and the second height difference Δh2 is set to be greater than the difference between Hcell and Ls/tan θ, light leakage may be prevented.

Meanwhile, although the case where both Δh1 and Δh2 are not 0, that is, the case where the top of the light shielding layer 210 is higher than that of the color filter 220 and the top of the bank layer 130 is higher than that of the light emitting layer 140 has been described as above, any one of Δh1 and Δh2 may be 0.

In other words, the top of the light shielding layer 210 may be set to be higher than that of the color filter 220 and the top of the bank layer 130 may be set to be equal to that of the light emitting layer 140. Also, the top of the light shielding layer 210 may be set to be equal to that of the color filter 220 and the top of the bank layer 130 may be set to be higher than that of the light emitting layer 140. However, a problem may occur when the height of the light shielding layer 210 is too high or the height of the bank layer 130 is too high. Accordingly, the top of the light shielding layer 210 may be formed to be higher than that of the color filter 220 and the top of the bank layer 130 is formed to be higher than that of the light emitting layer 140 if the problem occurs.

Figure 4:
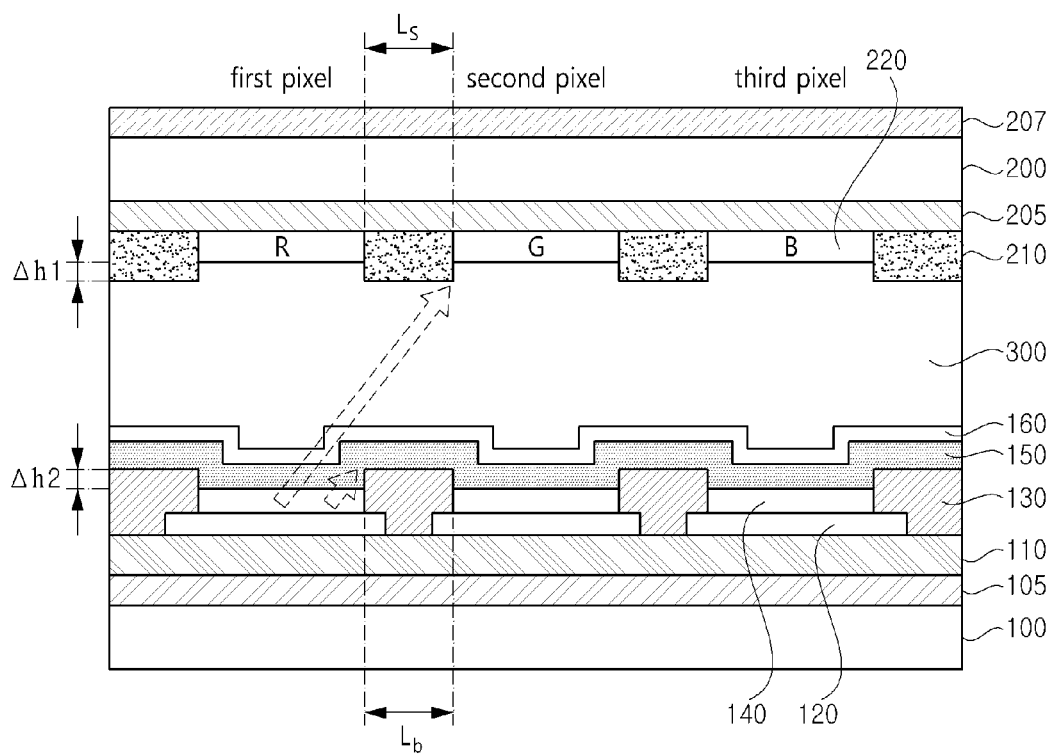
FIG. 4 is a cross-sectional view illustrating an organic light emitting display device according to another embodiment of the present invention.

FIG. 4 is a cross-sectional view illustrating an organic light emitting display device according to another embodiment of the present invention. The organic light emitting display device according to FIG. 4 is the same as that according to FIG. 2 except that a first barrier layer 105, a second barrier layer 205 and an anti-reflective layer 207 are additionally formed. Accordingly, same reference numbers are given to same elements, and different elements will only be described hereinafter.

As shown in FIG. 4, according to another embodiment of the present invention, the first barrier layer 105 is additionally formed between a first substrate 100 and a thin film transistor layer 110, the second barrier layer 205 is additionally formed between a second substrate 200 and a color filter 220, and the anti-reflective layer 207 is additionally formed on the other surface of the second substrate 200.

The first barrier layer 105 may be formed by depositing silicon oxide or silicon nitride on the entire surface of the first substrate 100. This first barrier layer 105 may serve to prevent external water or moisture from being permeated into the display device and shield components included in the first substrate 100 from being diffused into the thin film transistor layer 110 during a deposition process of high temperature, for forming the thin film transistor layer 110.

The second barrier layer 205 may be formed by being deposited on the entire surface of the second substrate 200. Similarly to the first barrier layer 105, the second barrier layer 205 serves to prevent external water or moisture from being permeated into the display device and shield components included in the second substrate 200 from being diffused into the color filter 220 during a deposition process of high temperature. This second barrier layer 205 may be made of silicon oxide or silicon nitride.

The anti-reflective layer 207 is formed on the other surface of the second substrate 200, which does not face the first substrate 100. The anti-reflective layer 207 improves picture quality by preventing external light from being reflected. Although the anti-reflective layer 207 may be deposited on the other surface of the second substrate 200 by using the anti-reflective coating process known in the art, the anti-reflective layer 207 may be adhered to the other surface of the second substrate 200 in the form of a film as the case may be.

Meanwhile, although not shown, a touch sensor may additionally be formed between the anti-reflective layer 207 and the second substrate 200. The touch sensor may be formed between the second barrier layer 205 and the color filter 220 without being formed between the anti-reflective layer 207 and the second substrate 200. This touch sensor may include, but not limited to, a first touch electrode for sensing a touch position of an X axial direction and a second touch electrode for sensing a touch position of a Y axial direction. Various touch sensors known in the art may be used.

Figure 5:
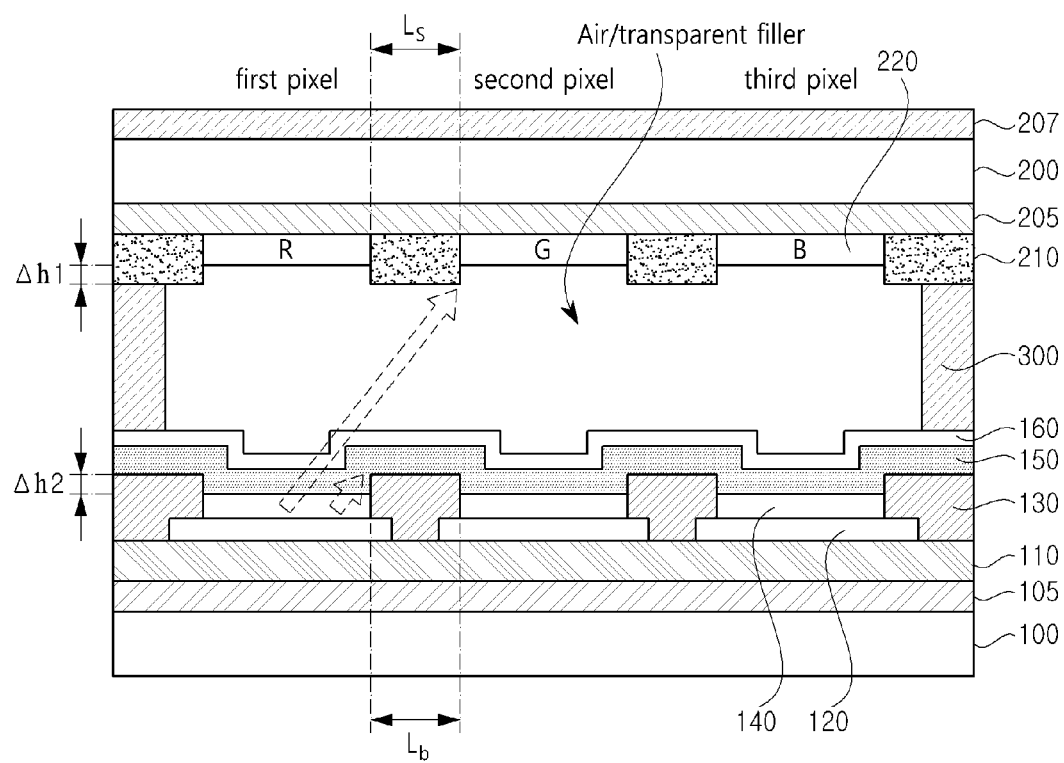
FIG. 5 is a cross-sectional view illustrating an organic light emitting display device according to still another embodiment of the present invention.

FIG. 5 is a cross-sectional view illustrating an organic light emitting display device according to still another embodiment of the present invention. The organic light emitting display device according to FIG. 5 is the same as that according to FIG. 2 except that an adhesive layer 300 is varied. Accordingly, same reference numbers are given to same elements, and different elements will only be described hereinafter.

According to FIG. 2, the adhesive layer 300 is formed in an entire region between the first substrate 100 and the second substrate 200, wherein the entire region includes a display region where picture image is displayed and a peripheral region where picture image is not displayed.

On the other hand, according to FIG. 5, the adhesive layer 300 is formed in only peripheral regions of the first substrate 100 and the second substrate 200. The adhesive layer 300 is not formed in the display region between the first substrate 100 and the second substrate 200, and the display region, where the adhesive layer 300 is not formed, between the first substrate 100 and the second substrate 200, exists as a third layer such as air or transparent filler. The transparent filler may be made of a transparent polymer resin.

In the organic light emitting display device according to FIG. 5, the length Hcell between the light emitting layer 140 and the color filter 220 may become sum of thicknesses of the second electrode 150, the passivation layer 150 and the air layer.

Figure 6:
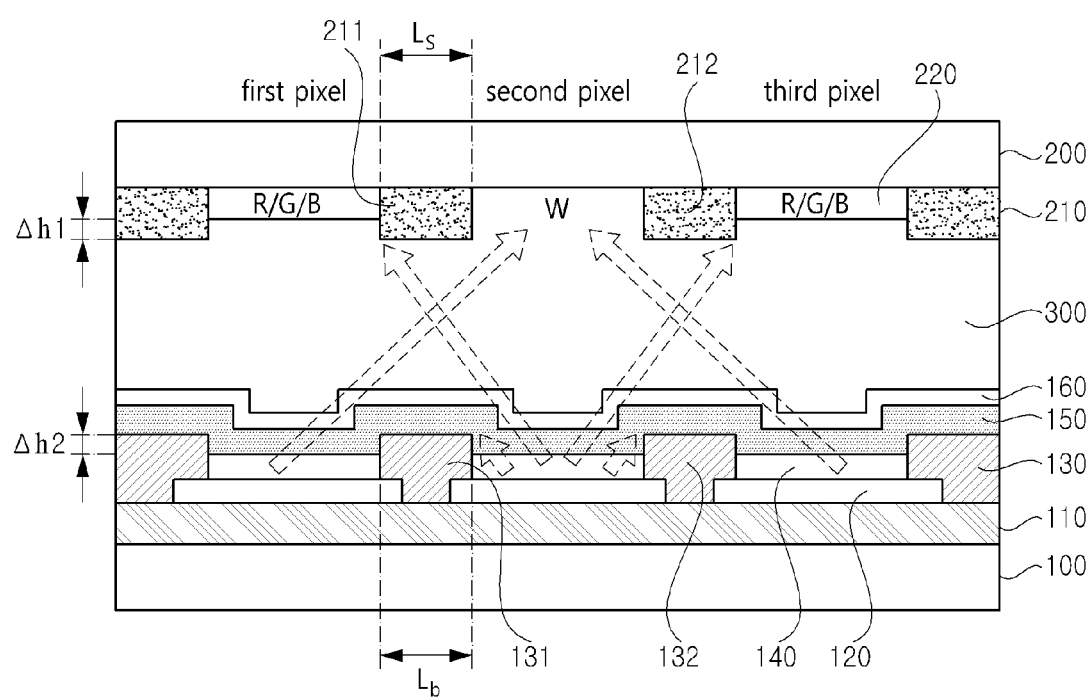
FIG. 6 is a cross-sectional view illustrating an organic light emitting display device according to further still another embodiment of the present invention.

FIG. 6 is a cross-sectional view illustrating an organic light emitting display device according to further still another embodiment of the present invention, and relates to an organic light emitting display device having red (R), green (G), blue (B) and white (W) pixels. Same reference numbers are given to same elements, and different elements will only be described hereinafter.

As shown in FIG. 6, a first pixel emitting any one of red (R) light, green (G) light and blue (B) light is arranged at one side of a second pixel, which emits white (W) light, on the basis of the second pixel, and a third pixel emitting any other one of red (R) light, green (G) light and blue (B) light is arranged at the other side of the second pixel.

At this time, although the color filter 220 is formed at the first pixel and the third pixel, no color filter is formed at the second pixel. In other words, white (W) light emitted from the light emitting layer 140 only passes through the second pixel emitting white (W) light, the second pixel does not need a separate color filter.

In the organic light emitting display device according to FIG. 6, since both the light emitted from the light emitting layer 140 of the first pixel and the light emitted from the light emitting layer 140 of the third pixel are the white (W) light, even though the white (W) light of the first pixel and the third pixel enters a region for the second pixel, that is, a region between the first light shielding layer 211 and the second light shielding layer 212, a problem in change of gray scale does not occur.

However, if the light emitted from the light emitting layer 140 of the second pixel passes through the color filter 220 of the first pixel or the third pixel, a problem in change of gray scale of the light emitted from the first pixel or the third pixel occurs.

Accordingly, although the second pixel emitting white (W) light does not have a color filter, the heights of the first light shielding layer 211 and the second light shielding layer 212, which are arranged near the second pixel, may be equal to those in the aforementioned embodiment. In other words, the first pixel having the color filter 220 is adjacent to one side of the first light shielding layer 211, and the second pixel having no color filter is adjacent to the other side of the first light shielding layer 211. In this case, it is preferable that the top of the first light shielding layer 211 may be higher than the top of the color filter 220 of the first pixel and the height difference between the top of the first light shielding layer 211 and the top of the color filter 220 of the first pixel is set in accordance with the aforementioned Equation 6.

Also, the second pixel having no color filter is adjacent to one side of the second light shielding layer 212, and the third pixel having the color filter 220 is adjacent to the other side of the second light shielding layer 212. In this case, the top of the second light shielding layer 212 may be higher than the top of the color filter 220 of the third pixel and the height difference between the top of the second light shielding layer 212 and the top of the color filter 220 of the third pixel is set in accordance with the aforementioned Equation 6.

According to the present invention described as above, at least the following advantages may be obtained.

According to one embodiment of the present invention, since the height of the light shielding layer is higher than that of the color filter and the height of the bank layer is higher than that of the light emitting layer, the light emitted from the light emitting layer of one pixel may pass through the color filter of another adjacent pixel within the minimum range or may be prevented from passing through the color filter of another adjacent pixel, whereby picture quality is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device having a first pixel area and a second pixel area, the organic light emitting display device comprising:
   a first substrate;
   a second substrate facing the first substrate;
   a bank layer of a light shielding material on the first substrate at a boundary region between the first and second pixel areas;
   a light emitting layer on the first substrate within the first pixel area;
   a light shielding layer on the second substrate at the boundary region between the first and second pixel areas; and
   a color filter on the second substrate within the first pixel area,
   wherein a top of the bank layer is higher than a top of the light emitting layer with respect to the first substrate, and a top of the light shielding layer is higher than a top of the color filter with respect to the second substrate,
   wherein a first height difference ($\Delta h1$) between the top of the bank layer and the top of the light emitting layer and a second height difference ($\Delta h2$) between the top of the light shielding layer and the top of the color filter are set to satisfy the following Equation:

$$H\text{cell} - Ls/\tan\theta \leq \Delta h1 + \Delta h2$$

where Hcell is a distance between the light emitting layer and the color filter, Ls is a width of the light shielding layer, $\theta$ is a maximum viewing angle for preventing light leakage from occurring between the first and second pixel areas, and Hcell is greater than the sum of the first and second height differences.

2. The organic light emitting display device of claim 1, wherein the bank layer and the light emitting layer do not overlap each other with respect to a direction normal to the first substrate, and wherein the light shielding layer and the color filter do not overlap each other with respect to a direction normal to the second substrate.

3. The organic light emitting display device of claim 1, wherein the light shielding layer overlaps the bank layer, and wherein a width of the light shielding layer is equal to a width of the bank layer.

4. The organic light emitting display device of claim 1 wherein an electrode, a passivation layer and an adhesive layer are disposed between the light emitting layer and the color filter, and wherein Hcell is a sum of a thicknesses of the electrode, the passivation layer and the adhesive layer.

5. The organic light emitting display device of claim 1, wherein an electrode, a passivation layer and a third layer are disposed between the light emitting layer and the color filter, and wherein Hcell is a sum of a thicknesses of the electrode, the passivation layer and the third layer.

6. The organic light emitting display device of claim 1, wherein a first electrode is on one surface of the light emitting layer, and a second electrode is on another surface of the light emitting layer, the first electrode being made of an opaque conductive material and being electrically connected with a thin film transistor.

7. The organic light emitting display device of claim 1, wherein another light emitting layer is on the first substrate within the second pixel area, and wherein the light emitting layers of each of the first and second pixel areas emit white light, and the color filter is not formed on the second substrate within the second pixel areas.

8. An organic light emitting display device having a first pixel area and a second pixel area, the organic light emitting display device comprising:
   a first substrate;
   a second substrate facing the first substrate;
   a bank layer on the first substrate at a boundary region between the first and second pixel areas;
   a light emitting layer on the first substrate within the first pixel area;
   a light shielding layer on the second substrate at the boundary region between the first and second pixel areas; and
   a color filter on the second substrate within the first pixel area,
   wherein a first height difference ($\Delta h1$) between a top of the bank layer and a top of the light emitting layer with respect to the first substrate and a second height difference ($\Delta h2$) between a top of the light shielding layer and a top of the color filter with respect to the second substrate are set to satisfy the following Equation:

$$H\text{cell} - Ls/\tan\theta \leq \Delta h1 + \Delta h2$$

where Hcell is a distance between the light emitting layer and the color filter, Ls is a width of the light shielding layer, $\theta$ is a maximum viewing angle for preventing light leakage from occurring between the first and second pixel areas, and Hcell is greater than the sum of the first and second height differences.

9. The organic light emitting display device of claim 8, wherein any one of $\Delta h1$ and $\Delta h2$ is 0.

10. The organic light emitting display device of claim 1, wherein the top of the light shielding layer includes a first substantially flat surface and the top of the bank layer includes a second substantially flat surface that overlaps the first substantially flat surface, and
    wherein a width of the first substantially flat surface is substantially equal to a width of the second substantially flat surface.

11. The organic light emitting display device of claim 1, wherein the bank layer defines a substantially vertical wall at a boundary with the light emitting layer.

12. The organic light emitting display device of claim 8, wherein the bank layer defines a substantially vertical wall at a boundary with the light emitting layer, the wall having a height equal to the first height difference.

13. The organic light emitting display device of claim 1, wherein the bank layer has substantially vertical walls at opposite sides thereof with the top of the bank layer extending between the walls, the top of the bank layer being substantially flat and having the first height difference.

14. The organic light emitting display device of claim 8, wherein the bank layer has substantially vertical walls at opposite sides thereof with the top of the bank layer extending between the walls, the top of the bank layer being substantially flat and having the first height difference.

15. The organic light emitting display device of claim 8, further comprising:
    a first electrode under the light emitting layer and a second electrode on the light emitting layer,
    wherein the light emitting layer is not formed on a top of the bank layer, a top of the light emitting layer contacts a lower surface of the second electrode, and the top of the bank layer is higher than the top of the light emitting layer with respect to the first substrate.

16. The organic light emitting display device of claim 8, wherein the bank layer and the light emitting layer do not overlap each other with respect to a direction normal to the first substrate, and wherein the light shielding layer and the color filter do not overlap each other with respect to a direction normal to the second substrate.

17. The organic light emitting display device of claim 8, wherein the light shielding layer overlaps the bank layer, and wherein a width of the light shielding layer is equal to a width of the bank layer.

18. The organic light emitting display device of claim 15, wherein the first electrode is made of an opaque conductive material and is electrically connected with a thin film transistor.

19. The organic light emitting display device of claim 8, wherein another light emitting layer is on the first substrate within the second pixel area, and wherein the light emitting layers of each of the first and second pixel areas emit white light, and the color filter is not formed on the second substrate within the second pixel areas.

* * * * *